United States Patent [19]

Okamoto et al.

[11] Patent Number: 5,168,032
[45] Date of Patent: Dec. 1, 1992

[54] PHOTOPOLYMERIZABLE COMPOSITION INITIATED BY A COMBINATION OF BORON COMPOUND, DYE, AND HETEROCYCLIC COMPOUND

[75] Inventors: Yasuo Okamoto; Kouichi Kawamura, both of Shizuoka, Japan

[73] Assignee: Fuji Photo Film Co., Ltd., Ashigara, Japan

[21] Appl. No.: 547,165

[22] Filed: Jun. 28, 1990

Related U.S. Application Data

[63] Continuation-in-part of Ser. No. 320,535, Mar. 8, 1989, abandoned.

[30] Foreign Application Priority Data

Mar. 9, 1988 [JP] Japan ................. 63-55857

[51] Int. Cl.⁵ ............................. G03C 1/68
[52] U.S. Cl. ........................ 430/281; 430/270; 430/286; 522/15; 522/25
[58] Field of Search ............. 430/281, 270, 286; 522/15, 25

[56] References Cited

U.S. PATENT DOCUMENTS

| | | |
|---|---|---|
| 4,160,671 | 7/1979 | Stahlhofen ............... 96/91 D |
| 4,212,970 | 7/1980 | Iwasaki ................... 542/455 |
| 4,371,606 | 2/1983 | Donges ................... 430/281 |
| 4,371,607 | 2/1983 | Donges ................... 430/281 |
| 4,399,211 | 8/1983 | Kondo et al. ............. 430/269 |
| 4,701,399 | 10/1989 | Nagano et al. .......... 430/179 |
| 4,751,102 | 6/1988 | Adair et al. ............. 427/53.1 |
| 4,772,530 | 9/1988 | Gottschalk et al. ....... 522/25 |
| 4,772,541 | 9/1988 | Gottschalk et al. ..... 430/281 |
| 4,859,572 | 8/1989 | Farid et al. .............. 430/281 |
| 4,937,161 | 6/1990 | Kita et al. .............. 430/281 |
| 4,950,581 | 8/1990 | Koike et al. ............. 430/281 |

Primary Examiner—Marion E. McCamish
Assistant Examiner—Mark A. Chapman
Attorney, Agent, or Firm—Burns, Doane, Swecker & Mathis

[57] ABSTRACT

The present invention relates to a photopolymerizable composition having a high sensitivity to visible light of 400 nm or longer and comprising a photopolymerization initiator consisting of:

(a) a salt of an organic boron anionic compound with an organic and cationic dye or a combination of an organic and cationic dye with a salt of an organic boron anionic compound, and (b) a compound having the general formulae (I) to (VI) as defined in the present application.

14 Claims, No Drawings

PHOTOPOLYMERIZABLE COMPOSITION INITIATED BY A COMBINATION OF BORON COMPOUND, DYE, AND HETEROCYCLIC COMPOUND This is a continuation-in-part application of Ser. No. 320,535 filed Mar. 8, 1989, now abandoned.

BACKGROUND OF THE INVENTION

1. Field of the Invention

The present invention relates to a photopolymerizable composition. More particularly, the present invention relates to a photopolymerizable composition comprising a polymerizable compound having an ethylenically unsaturated bond, a photopolymerization initiator having a new composition and, if necessary, a linear organic polymer. The photopolymerizable composition is useful as a starting material for, for example, a photosensitive layer of a photosensitive printing plate sensitive to even light from a light source of an argon laser.

2. Prior Art

A process for duplicating an image by a photographic method with a photosensitive composition comprising a polymerizable compound having an ethylenically unsaturated bond, a photopolymerization initiator and, if necessary, a binder having a suitable film-forming capacity and a thermal polymerization inhibitor is well known. As described in U.S. Pat. Nos. 2,927,022, 2,902,356 and 3,870,524, such a photosensitive composition is photopolymerized and, therefore, cured and insolubilized when irradiated with light. Accordingly, a desired image can be formed with the photopolymerizable composition by forming a suitable film of the photosensitive composition, irradiating it with light through a negative of an intended image and removing only an unexposed part with a suitable solvent (this process will be hereinafter referred to as "development"). It is a matter of course that a photosensitive composition of this type is quite useful as a material for printing plates.

It has been known that when a polymerizable compound having an ethylenically unsaturated bond is used solely, a sufficient photosensitivity cannot be obtained. It has been proposed, therefore, to use a photopolymerization initiator for increasing the photosensitivity. Such photopolymerization initiators include, for example, benzil, benzoin, benzoin ethyl ether, Michler's ketone, anthraquinone, acridine, phenazine, benzophenone and 2-ethylanthraquinone. However, when such a photopolymerization initiator is used, it takes a long time to conduct the exposure for forming the image, because the photopolymerizable composition has only a low curing sensitivity. Therefore, in the reproduction of a minute image, it cannot be finely reproduced when even slight vibration takes place during the operation, and an increase in irradiation energy from the light source is necessitated in the exposing step. Consequently, the release of a large quantity of heat thus generated must be taken into consideration. Another defect is that the film made of the composition is deformed and denatured by heat.

The photopolymerization-initiating capacities of these photopolymerization initiators in the visible ray region longer than 400 nm are far lower than those in the ultraviolet region shorter than 400 nm. Therefore, the application of the photopolymerizable compositions containing a conventional photopolymerization initiator have been very limited.

Methods of improving a photopolymerizable system sensitive to the visible rays have been proposed. For example, U.S. Pat. No. 2,850,445 discloses that some kinds of photoreduction type dyes such as Rose Bengal, Eosine and Erythrocin have an effective sensitivity to the visible rays. Alternative techniques have been also proposed. In these techniques, a dye/amine complex initiator is used (Japanese Patent Publication for Opposition Purpose (hereinafater referred to as "J. P. KOKOKU") No. 44-20189); a combination system of a hexaarylbiimidazole with a radical-forming agent and a dye is used (J. P. KOKOKU No. 45-37377), a combination system of a hexaarylbiimidazole with a p-dialkylaminobenzylidene ketone is used (Japanese Patent Unexamined Published Application (hereinafter referred to as "J. P. KOKAI") Nos. 47-2528 and 54-155292); a combination system of a 3-keto-substituted coumarin compound with an active halogen compound is used (J. P. KOKAI No. 58-15503); and a combination system of a substituted triazine with a merocyanine pigment is used (J. P. KOKAI No. 54-151024). Although these techniques are effective for improving sensitivity to the visible rays, the sensitization velocities are still unsatisfactory. Under these circumstances, further improvement of the technique has been intensely demanded.

Now, investigation has been made in order to improve the sensitivity to U. V. rays and to form an image by means of laser. A U. V. projection exposure method for forming a printing plate, direct laser-engraving method, laser facsimile and holography are already practically in use. Further highly sensitive materials usable for these techniques are now being developed. However, their sensitivities are yet insufficient.

SUMMARY OF THE INVENTION

An object of the present invention is to provide a highly sensitive photopolymerizable composition.

Namely, the object of the present invention is to provide a photopolymerizable composition containing a photopolymerization initiator capable of increasing the photopolymerization speed of various photopolymerizable compositions containing a polymerizable compound having an ethylenically unsaturated bond.

Another object of the present invention is to provide a photopolymerizable composition containing a photopolymerization initiator highly sensitive to the visible ray longer than 400 nm, particularly to light around 488 nm of an Ar+ laser.

After intensive investigations made for the purpose of attaining the above-described objects, the inventors have found that a special photopolymerization initiator is capable of remarkably increasing the photopolymerization velocity of a polymerizable compound having an ethylenically unsaturated bond and that it is highly sensitive to even visible rays longer than 400 nm. The present invention has been completed on the basis of this finding.

The present invention relates to a photopolymerizable composition comprising an addition-polymerizable compound having at least one ethylenically unsaturated double bond, a photo-polymerization initiator and, if necessary, a linear organic polymer, characterized in that the photopolymerization initiator comprises:

(a) at least one salt of an organic boron anionic compound with an organic and cationic dye compound, and at least one of the compounds having the following general formulae (I), (II), (III), (IV), (V) and (VI), or (b) a combination of at least one organic and cationic dye with a salt of an organic boron anionic compound, and at least one of the compounds having the following general formulae (I), (II), (III), (IV), (V) and (VI):

Compound of the general formula (I):

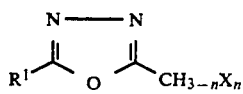

wherein $R_1$ represents an alkyl group, a substituted alkyl group, an alkenyl group, a substituted alkenyl group, an allyl group, a substituted allyl group, an aryl group, a substituted aryl group, a halogen atom, an alkoxy group, a substituted alkoxy group, a nitro group or a cyano group, X represents an halogen atom, and n represents an integer of 1 to 3, Compound of the general formula (II):

$R^2-Z-CH_{m-1}X_m-R^3$ wherein $R^2$ represents an aryl group or a substituted aryl group, $R^3$ represents

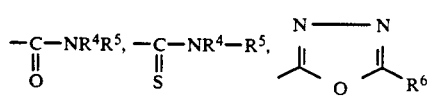

or a halogen atom,

Z represents

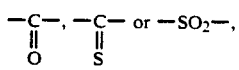

$R^4$ and $R^5$ represents an alkyl group, a substituted alkyl group, an alkenyl group, a substituted alkenyl group, an allyl group, a substituted allyl group, an aryl group or a substituted aryl group, $R^6$ is the same as $R^1$ of the general formula (I), X represents a halogen atom, and m represents 1 or 2, Compound of the general formula (III):

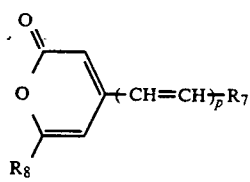

wherein $R_7$ represents a substituted or unsubstituted aryl group or a heterocyclic group, $R_8$ represents a trihaloalkyl or trihaloalkenyl group having 1 to 3 carbon atoms, and p represents 1, 2 or 3, Carbonylmethylene heterocyclic compound having a trihalogenomethyl group and being expressed by the general formula (IV):

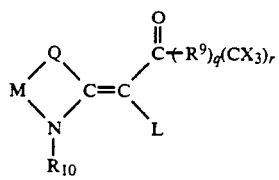

wherein:

L represents a hydrogen atom or a substituent of the formula:

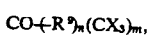

M represents a substituted or unsubstituted alkylene group,

Q represents a sulfur, selenium or oxygen atom, a dialkylmethylene group, an alken-1,2-ylene group, 1,2-phenylene group or an N-R group, M and Q together form a three-membered or four-membering ring, $R^9$ represents a carbocyclic or heterocyclic aromatic group, $R^{10}$ represents an alkyl group, an aralkyl group or an alkoxyalkyl group, X represents a halogen atom, and q is 0 and r is 1 or, alternatively, q is 1 and r is 1 or 2, 4-Halogeno-5-(halogenomethylphenyl)oxazole derivative having the general formula (V):

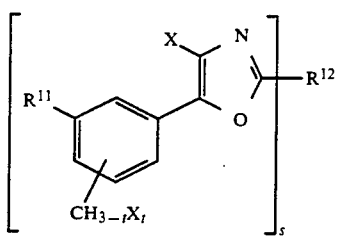

wherein

X represents a halogen atom, t represents an integer of 1 to 3, s represents an integer of 1 to 4, $R^{11}$ represents a hydrogen atom or a CH$_{3-t}$X$_t$ group, and $R^{12}$ represents a substituted or unsubstituted S-valent unsaturated organic group, and 2-(Halogenomethylphenyl)-4-halogenooxazole derivative of the general formula (VI):

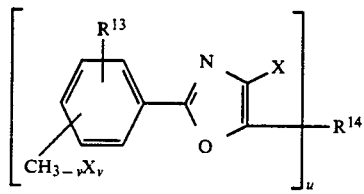

wherein

X represents a halogen atom, v represents an integer of 1 to 3,
u represents an integer of 1 to 4,
$R^{13}$ represents a hydrogen atom or a $CH_{3-\nu}X_\nu$ group,
$R^{14}$ represents a u-valent, substituted or unsubstituted unsaturated organic group.

DETAILED DESCRIPTION OF THE INVENTION

Polymerizable Compound

The polymerizable compounds having an ethylenically unsaturated bond usable in the present invention are those having at least one ethylenically unsaturated bond in their chemical structures. They include, for example, monomers, prepolymers such as dimers, trimers and oligomers, mixtures of them, and copolymers of them.

The monomers and their copolymers include, for example, esters of an unsaturated carboxylic acid with an aliphatic polyhydric alcohol compound and amides of an unsaturated carboxylic acid with an aliphatic polyvalent amine compound.

The monomeric esters of an aliphatic polyhydric alcohol compound with an unsaturated carboxylic acid include, for example, acrylic esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate and polyester acrylate oligomers.

The methacrylic esters include, for example, tetramethylene glycol dimethacrylate, triethylene glycol dimethacrylate, neopentyl glycol dimethacrylate, trimethylolpropane trimethacrylate, trimethylolethane trimethacrylate, ethylene glylol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2 -hydroxypropoxy)-phenyl]dimethylmethane and bis-[p-(acryloxyethoxy)-phenyl]dimethylmethane.

Itaconic esters include, for example, ethylene glycol diitaconate, propylene glycol diitaconate, 1,3-butanediol diitaconate, 1,4-butanediol diitaconate, tetramethylene glycol diitaconate, pentaerythritol and sorbitol tetraitaconate.

Crotonic esters include, for example, ethylene glycol dicrotonate, tetramethylene glycol dicrotonate, pentaerythritol dicrotonate and sorbitol tetradicrotonate.

Isocrotonic esters include, for example, ethylene glycol diisocrotonate, pentaerythritol diisocrotonate and sorbitol tetraisocrotonate.

Maleic esters include, for example, ethylene glycol dimaleate, triethylene glycol dimaleate, pentaerythritol dimaleate and sorbitol tetramaleate.

Further mixtures of the above-described ester monomers are also usable.

The monomeric amides from an aliphatic polyvalent amine compound and an unsaturated carboxylic acid include, for example, methylenebisacrylic amide, methylenebismethacrylic amide, 1,6-hexamethylenebisacrylic amide, 1,6-hexamethylenebismethacrylic amide, diethylenetriaminetrisacrylic amide, xylylenebisacrylic amide and xylylenebismethacrylic amide.

Other examples include vinylurethane compounds having two or more polymerizable vinyl groups in the molecule which are prepared by adding a vinyl monomer having a hydroxyl group and the following general formula (A):

$$CH_2=C(R)COOCH_2CH(R')OH \quad (A)$$

wherein R and R' each represents H or $CH_3$, to a polyisocyanate compound having at least two isocyanate groups in the molecule as described in J. P. KOKOKU No. 48-41708.

Further, the urethane acrylates described in J. P. KOKAI No. 51-37193, the polyfunctional acrylates or methacrylates such as polyester acrylates and epoxy acrylates prepared by reacting an epoxy resin with (meth)acrylic acid, as described in J. P. KOKAI No. 48-64183 and J. P. KOKOKU Nos. 49-43191 and 52-30490. The compounds described as photosetting monomers and oligomers in Nippon Setchaku Kyokai-shi (Japan Adhesive Society), Vol. 20, No. 7, pages 300 to 308.are also usable.

These compounds are used in an amount of 5 to 50 wt.% (hereinafter referred to merely as "%"), preferably 10 to 40%, based on the total components.

Photopolymerization Initiator

The following description relates to the photopolymerization initiator which is significant for the photopolymerizable composition of the present invention.

The compounds of the general formula (I) can be easily prepared by those skilled in the art according to, for example, a process described by M. P. Hutt, E. F. Elslager and L. M. Werbel in "Journal of Heterocyclic Chemistry", Vol. 7, No. 3.

Examples of the specific compounds having the general formula (I) usable in the present invention are as follows:

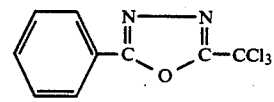

No. 1

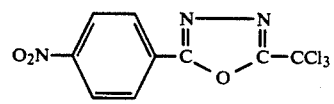

No. 2

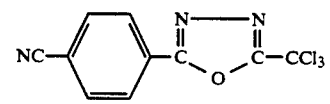

No. 3

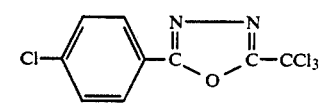

No. 4

-continued
No. 5 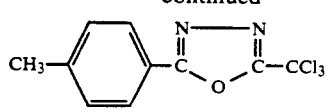
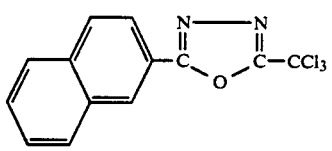
No. 6
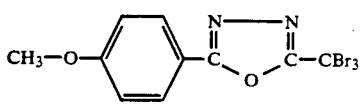
No. 7
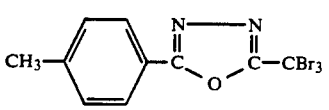
No. 8
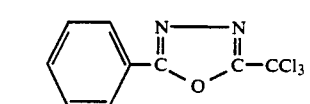
No. 9
No. 10
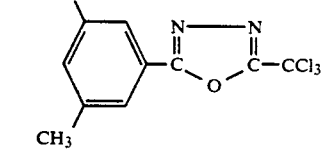
No. 11
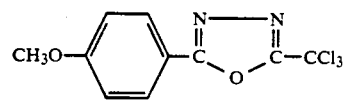
No. 12
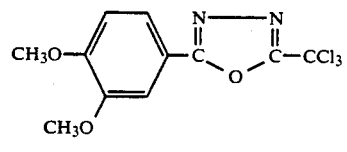
No. 13
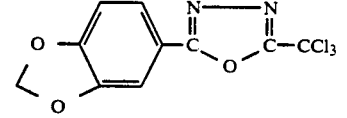
No. 14
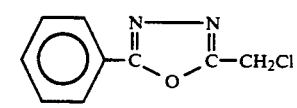
No. 15
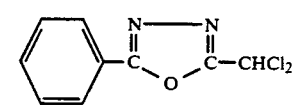
No. 16
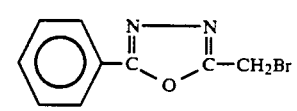
-continued
No. 17 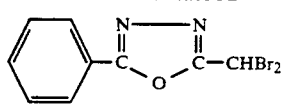
No. 18 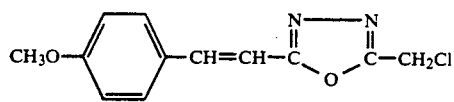
No. 19 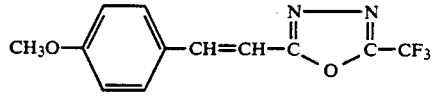
No. 20 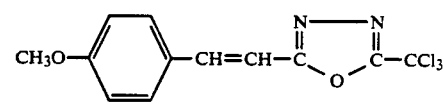
No. 21 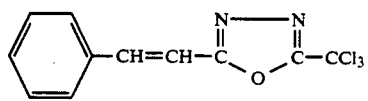
No. 22
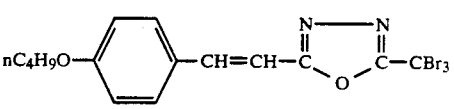
No. 23
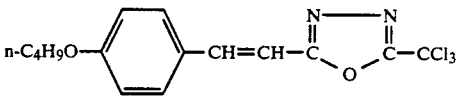
No. 24
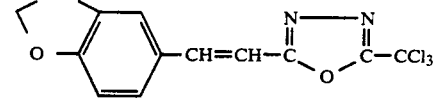
No. 25
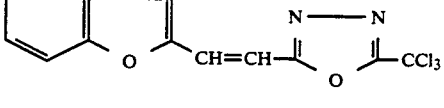
No. 26
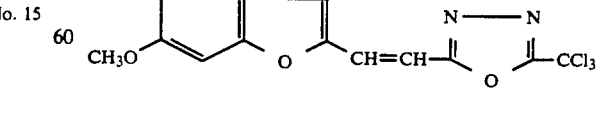
No. 27
No. 28
No. 29
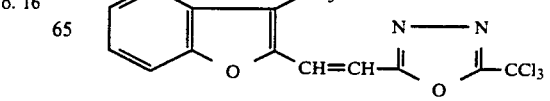

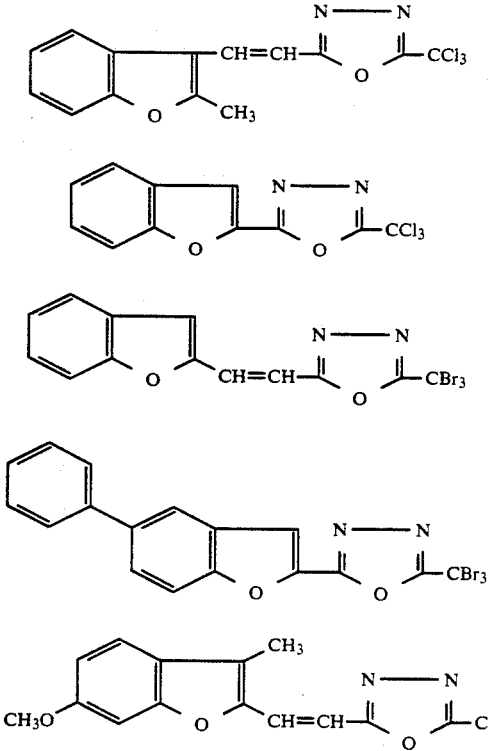
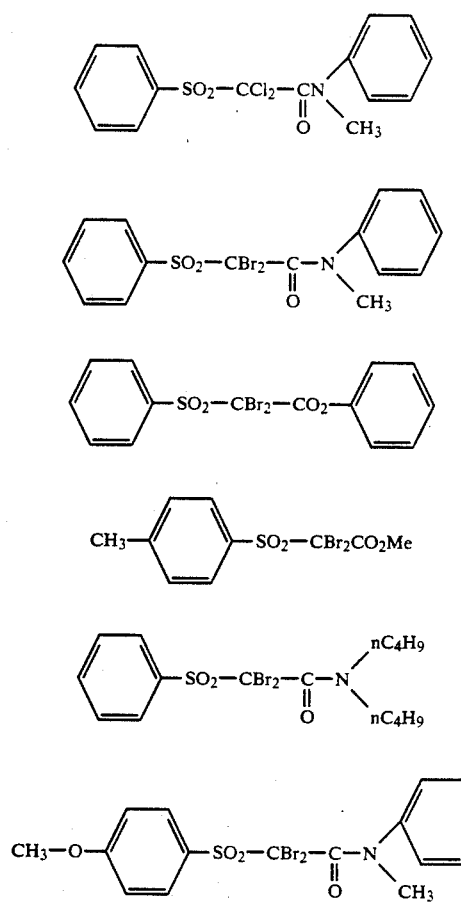
The specific compounds having the general formula (II) are as follows:

-continued

No. 51 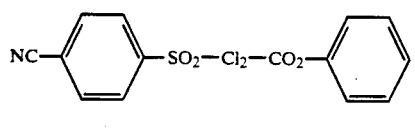

No. 52 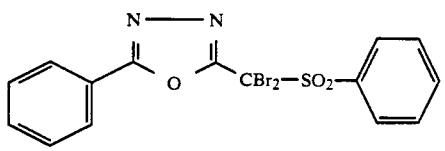

No. 53 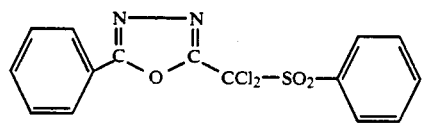

No. 54 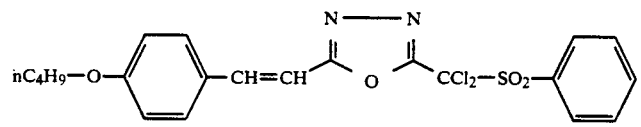

No. 55 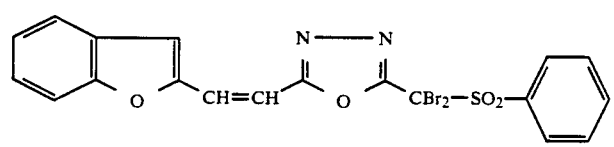

Among the above particularly preferred compounds are Compound Nos. 39 to 46 and Nos. 52 to 55.

The compounds of general formula (III) include, for example, those described in German Patent No. 2,641,100, such as 4-(4-methoxystyryl)-6-(3,3,3-trichloropropenyl)-2-pyrrone and 4-(3,4,5-trimethoxystyryl)-6-trichloromethyl-2-pyrrone.

The compounds of general formula (IV) include, for example, those described in German Patent No. 3,333,450, such as those shown in the following table:

| | $Q = S; R^9 =$ benzene ring | | | | |
|---|---|---|---|---|---|
| Compound No. | $R^{10}$ | M | L | q | $(CX_3)\gamma$ |
| 56 | $C_2H_5$ | 1,2-phenylene | H | 1 | $4\text{-}CCl_3$ |
| 57 | $CH_2C_6H_5$ | 1,2-phenylene | H | 1 | $4\text{-}CCl_3$ |
| 58 | $C_2H_5$ | 1,2-phenylene | H | 1 | $3\text{-}CCl_3$ |
| 59 | $C_2H_5$ | 1,2-phenylene | H | 1 | $4\text{-}CF_3$ |
| 60 | $C_2H_5$ | 5-$CH_3$-1,2-phenylene | H | 0 | $CCl_3$ |
| 61 | $CH_2C_6H_5$ | 1,2-phenylene | H | 0 | $CCl_3$ |
| 62 | $C_2H_4OCH_3$ | 1,2-phenylene | H | 1 | $4\text{-}CCl_3$ |

The compounds of general formula (V) include, for example, those described in German Patent No. 3,021,590, such as those shown below:

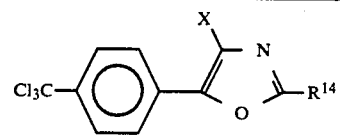

| | $R^{14}$ | X |
|---|---|---|
| No. 63 | 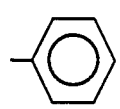 | Cl |
| No. 64 | 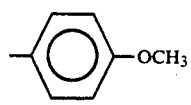 | Cl |
| No. 65 | 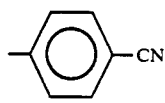 | Cl |

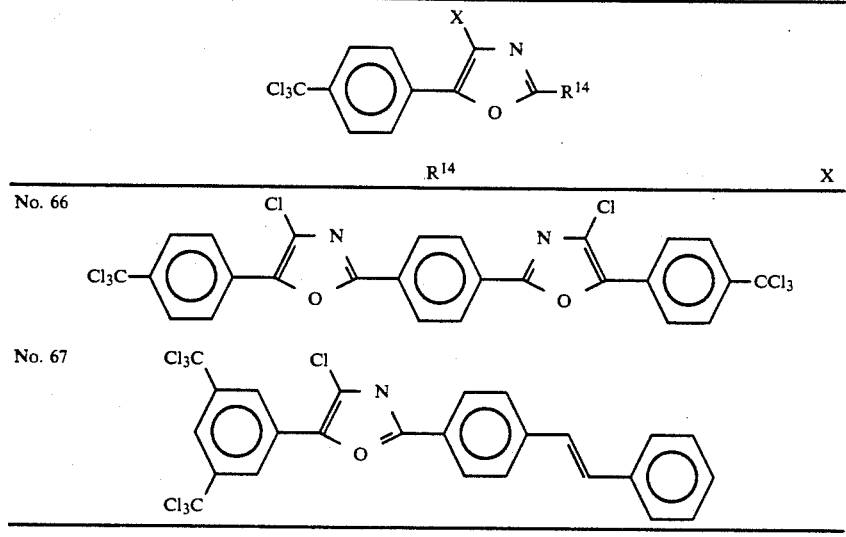

Specific compounds having the general formula (VI) include, for example, those described in German Patent No. 3,021,599, such as the following compounds:

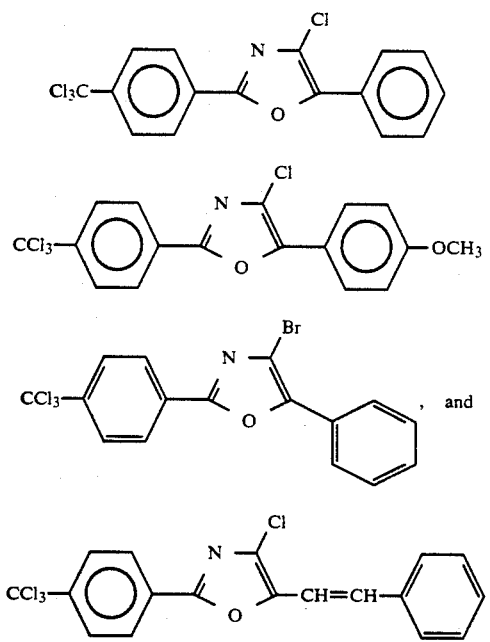

Organic Boron Anionic Compound/Organic and Cationic Dye

Salts of an Organic boron anionic compound with an organic and cationic dye, which are effectively usable in the present invention include, for example, those having the general formula (VII):

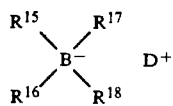

wherein $D^+$ represents an organic and cationic dye, $R^{15}$, $R^{16}$, $R^{17}$ and $R^{18}$ may be the same or different and each represents an alkyl group, an aryl group, an aralkyl group, an alkaryl group, an alkenyl group, an alkynyl group, an alicyclic group, a heterocyclic group, an allyl group, or a group derived from such a group, or two or more of $R^{15}$, $R^{16}$, $R^{17}$ and $R^{18}$ may be bonded together to form a cyclic structure.

Organic and cationic dyes usable in the present invention includes, for example, cationic methine dyes, such as preferably polymethine dyes, cyanine dyes, azomethine dyes and particularly preferably cyanine, carbocyanine and hemicyanine dyes; carbonium dyes such as preferably triarylmethane dyes, xanthene dyes, acridine dyes and more preferably Rhodamine; quinoneimine dyes such as preferably azine dyes, oxazine dyes and thiazine dyes; quinoline dyes; and thiazole dyes and (thia)pyrylium dyes. These dyes may be used either singly or as a combination thereof.

The above-described organic and cationic dyes, which are commercially available or known in the art, can be used in the present invention. These dyes are described in, for example, Paragraphs of Basic Dyes of "Senryo Binran (Dye Handbook)" edited by Yuki Kagaku Kyokai (Organic Chemistry Society); T. H. James, "The Theory of the Photographic Process" published by Macmillan Publishing Co., Inc. in 1977, pages 194 to 290; "Kinosei Shikiso no Kagaku (Chemistry on Functional Dyestuff)" published by CMC Publishing Co., pages 1 to 32, 189 to 206 and 401 to 413; and J. P. KOKAI No. 59-189340.

Among the dyes mentioned above, those particularly useful in the present invention are cyanine and xanthene dyes. Examples of the cyanine dyes useful in the present invention include the dyes of following general formula (X):

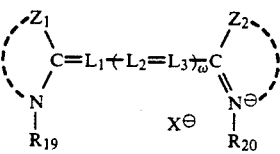

wherein, $Z_1$ and $Z_2$ each represents an atomic group necessary for forming a usual heterocyclic nucleus of a cyanine dye such as thiazole, thiazoline, benzothiazole, naphthothiazole, oxazole, oxazoline, benzoxazole, naphthoxazole, tetrazole, pyridine, quinoline, imidazoline, imidazole, benzimidazole, naphthoimidazole, selenazoline, selenazole, benzoselenazole, naphthoselenazole or indolenine nucleus which may be substituted with a lower alkyl group such as a methyl group, a halogen atom, a phenyl group, a hydroxyl group, an alkoxy group having 1 to 4 carbon atoms, a carboxyl group, an alkoxycarbonyl group, an alkylsulfamoyl group, an alkylcarbamoyl group, an acetyl group, an acetoxy group, a cyano group, a trichloromethyl group, a trifluoromethyl group or a nitro group, $L_1$, $L_2$ and $L_3$ each represents a methine group which may be substituted with a lower alkyl group such as a methyl or ethyl group, a phenyl group, a substituted phenyl group, a methoxy group, an ethoxy group or an aralkyl group such as a phenethyl group, $L_1$ and $R_{19}$, $L_3$ and $R_{20}$, or $L_2$ and $L_2$ (in case $\omega$ is 3) may form an alkylene crosslinkage to form a five-membered or six-membered ring, $R_{19}$ and $R_{20}$ each represents a lower alkyl group (preferably an alkyl group having 1 to 8 carbon atoms), a carboxyl group, a sulfo group, a hydroxyl group, a halogen atom, an alkoxy group having 1 to 4 carbon atoms, a phenyl group or an alkyl group having a substituent such as a substituted phenyl group (preferably the alkylene moiety thereof having 1 to 5 carbon atoms) such as a $\beta$-sulfoethyl, $\gamma$-sulfopropyl, $\gamma$-sulfobutyl, $\delta$-sulfobutyl, 2-[2-(3-sulfopropoxy)ethoxy]ethyl, 2-hydroxysulfopropyl, 2-chlorosulfopropyl, 2-methoxyethyl, 2-hydroxyethyl, carboxymethyl, 2-carboxyethyl, 2,2,3,3'-tetrafluoropropyl or 3,3,3-trifluoroethyl group, an allyl group or a substituted alkyl group usually contained in cyanine dyes as an N-substituent, $\omega$ represents a number of 1, 2 or 3, and $X^-$ represents the boron anionic compound of the above formula (VII).

Examples of the xanthene dyes useful in the present invention include those having the following formula (XI):

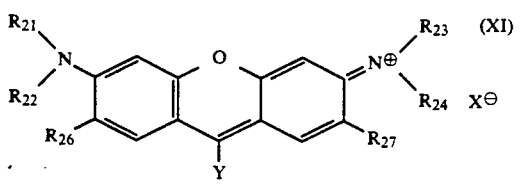

wherein $R_{21}$, $R_{22}$, $R_{23}$ and $R_{24}$ each represents a hydrogen atom, an alkyl group having 1 to 6 carbon atoms or an aryl group; $R_{26}$ and $R_{27}$ each represents a hydrogen atom, a substituted or unsubstituted alkyl group, a substituted or unsubstituted alkenyl group, a substituted or unsubstituted alkynyl group or, a substituted or unsubstituted aryl group;

Y represents a hydrogen atom, a substituted or unsubstituted alkyl group, a substituted or unsubstituted alkenyl group, a substituted or unsubstituted alkynyl group, a substituted or unsubstituted aryl group, a substituted or unsubstituted heterocyclic group, or

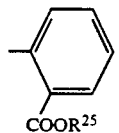

(wherein $R^{25}$ represents the same group as $R^{26}$ or an alkaline metal); and X represents the boron anionic compound of the above formula (VII).

An alkyl group represented by $R^{25}$, $R^{26}$, $R^{27}$ and Y includes a straight, branched or cyclic alkyl group and preferably has 1 to 18 carbon atoms, such as a methyl group, an ethyl group, a propyl group, an isopropyl group, a butyl group, a pentyl group, a hexyl group, an octyl group, a stearyl group, a cyclobutyl group, a cyclopentyl group, a cyclohexyl group, etc.

A substituted alkyl group represented by $R^{25}$, $R^{26}$, $R^{27}$ and Y includes an alkyl group described above having a substituent, such as a halogen atom, e.g., a chlorine atom, a bromine atom, etc.; a cyano group; a nitro group; an aryl group, preferably, a phenyl group; a hydroxyl group; a $-N=R^{28}R^{29}$ group, wherein $R^{28}$ and $R^{29}$ each represents a hydrogen atom, an alkyl group having 1 to 14 carbon atoms or an aryl group; a $COOR^{30}$ group, wherein $R^{30}$ represents a hydrogen atom, an alkyl group having 1 to 14 carbon atoms or an aryl group; an $-OCOR^{31}$ group or an $-OR^-$group, wherein $R^{31}$ represents an alkyl group having 1 to 14 carbon atoms or an aryl group.

An aryl group represented by $R^{25}$, $R^{26}$, $R^{27}$ and Y includes an aryl group having 1 to 3 rings, such as a phenyl group, a naphthyl group, etc., and a substituted aryl group represented by $R^{25}$, $R^{26}$, $R^{27}$ and Y includes an aryl group described above having the same substituent as that for the alkyl group or an alkyl group having 1 to 14 carbon atoms.

An alkenyl group represented by $R^{25}$, $R^{26}$, $R^{27}$ and Y includes a straight, branched or cyclic alkenyl group having 2 to 18 carbon atoms and a substituent for the alkenyl group includes the same substitueht as that for the alkyl group.

An alkynyl group represented by $R^{25}$, $R^{26}$, $R^{27}$ and Y includes a straight or branched alkynyl group having 2 to 18 carbon atoms, and a substituent for the alkynyl group includes the same substituent as that for the alkyl group.

A heterocyclic group represented by Y includes a 5 or more-membered ring, preferably 5 to 7-membered ring containing at least one atom selected from the group consisting of N, S and 0, and the heterocyclic ring may contain a condensed ring. The substituent for the heterocyclic group includes the same substituent as that for the aryl group.

Examples of preferred salts of the organic anionic boron compound with the organic and cationic dye compound usable in the present invention will be shown below, which examples by no means limit the scope of the present invention.

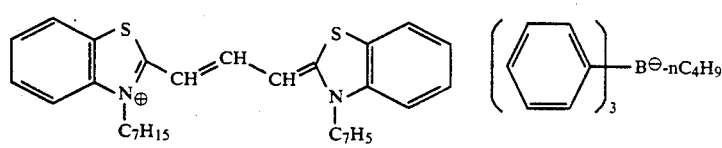 No. 72
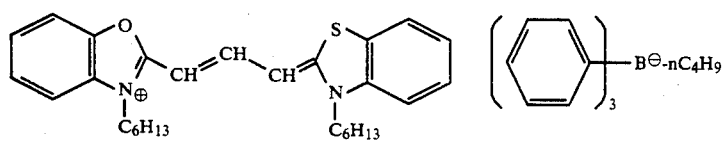 No. 73
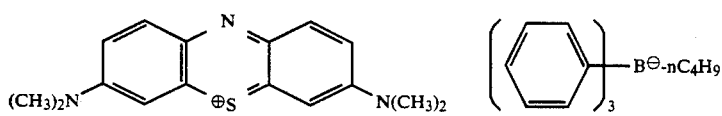 No. 74
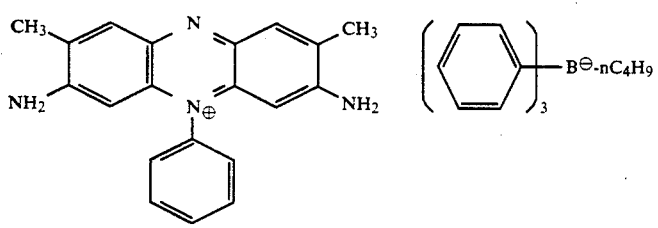 No. 75
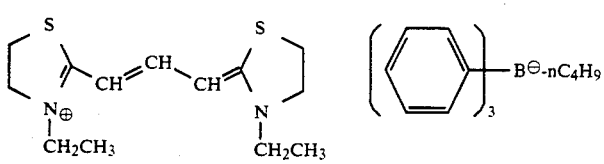 No. 76
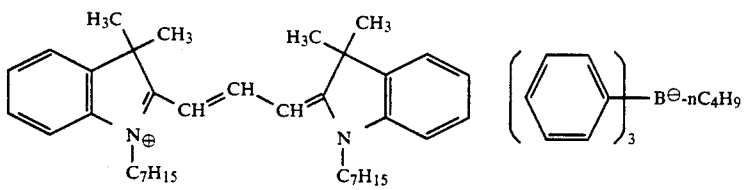 No. 77
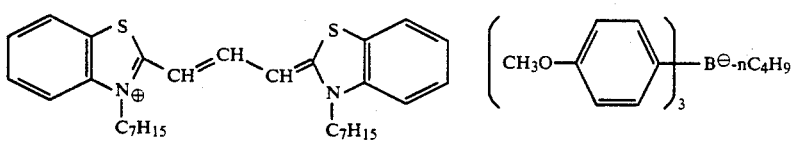 No. 78
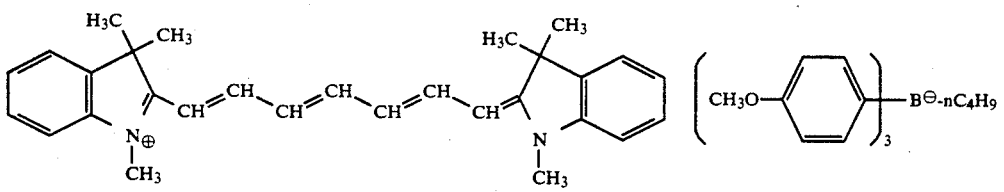 No. 79
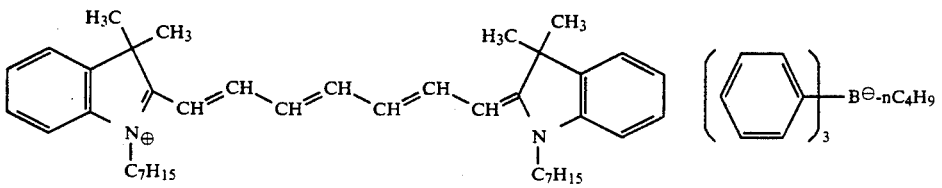 No. 80

-continued

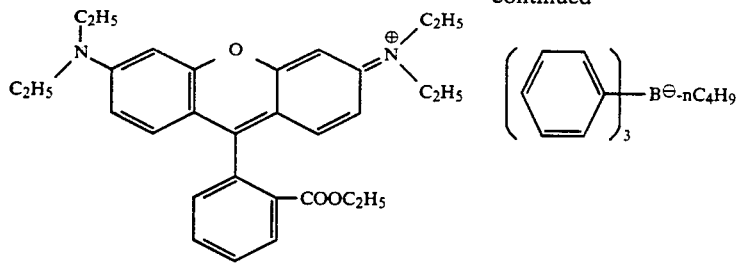 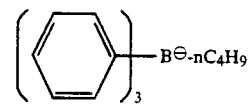  No. 81

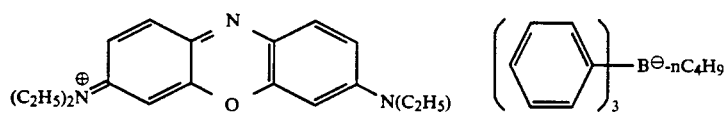 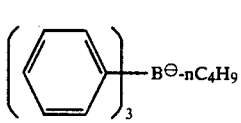  No. 82

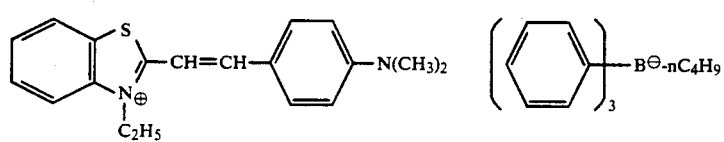 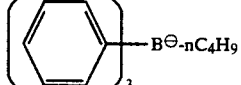  No. 83

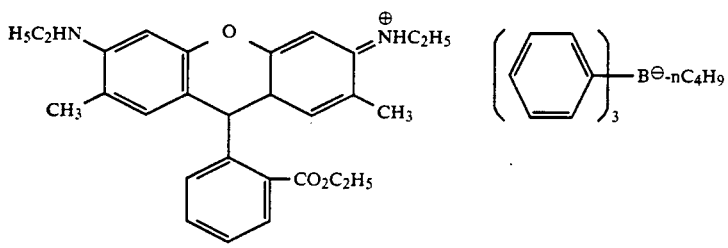 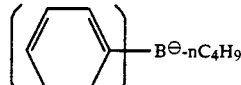  No. 84

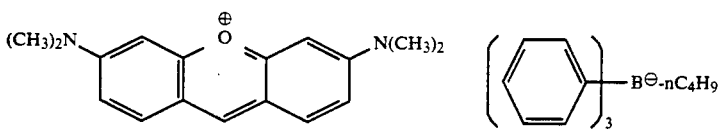 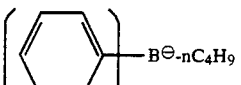  No. 85

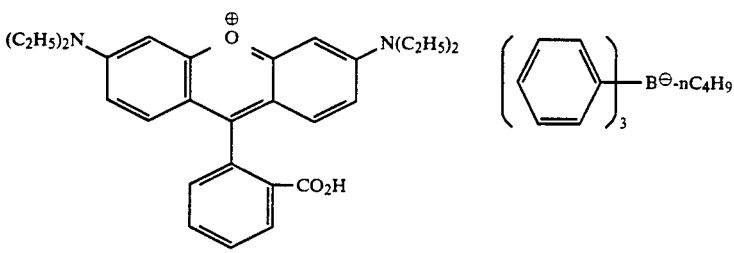  No. 86

The organic and cationic dye compounds used in the combination with the organic boron anionic compound include dye salts of the above mentioned Nos. 72 to 86 with anions other than the anions of the organic boron anionic compounds. The anions other than those of the organic boron anionic compounds include, for example, $Cl^-$, $Br^-$, $F^-$, $BF_4^-$, $ClO_4^-$ and $PF_6^-$. Among them, $Cl^-$, $Br^-$, $BF_4^-$ and $ClO_4^-$ are preferred.

The organic boron anionic compounds to be combined with the organic and cationic dye compounds include, for example, the following compounds and also compounds described in U.S. Pat. Nos. 3,567,453 and 4,343,891 and European Patent Nos. 109,772 and 109,773:

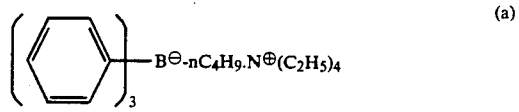  (a)

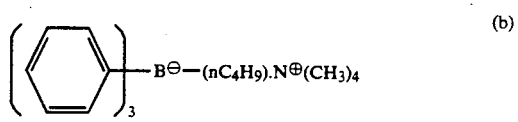  (b)

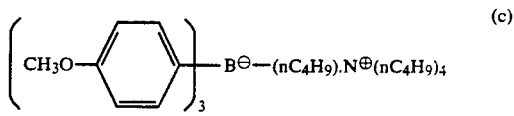  (c)

-continued

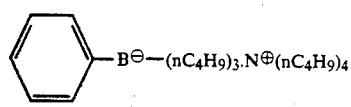
(d)

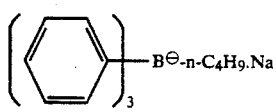
(e)

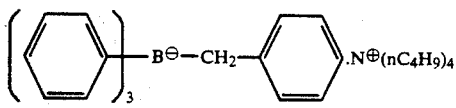
(f)

(g)

Counter cations to the organic boron anionic compounds include, for example, alkali metal cations and quaternary ammonium cations such as quaternary amines, etc.

The concentration of the photopolymerization initiator in the present composition is usually quite low. When it is excessively high, undesirable results such as screening of effective light are caused. For obtaining good results, the amount of the photopolymerization initiator in the present invention is preferably in the range of 0.01 to 60%, particularly preferably 1 to 30%, based on the total amount of the photopolymerizable ethylenically unsaturated compound and a linear organic polymer which is added if necessary.

Linear Organic Polymer

The "linear organic polymer" usable in the present invention may be any kind of organic polymer so far as it is compatible with the photopolymerizable ethylenically unsaturated compound. They are preferably linear organic polymers soluble in or swellable in water or in a weakly alkaline aqueous solution usable for the development. The linear organic polymer is used as a film-forming agent for the composition depending on the kind of the developer such as water, a weakly aqueous alkaline solution or an organic solvent developer. For example, when such a water-soluble organic polymer is used, the development with water is made possible. The linear organic polymers include, for example addition polymers having a carboxylic acid in its side chain such as those described in J. P. KOKOKU Nos. 54-34327, 58-12577 and 54-25957 and J. P. KOKAI Nos. 54-92723, 59-44615, 59-53836 and 59-71048. Namely, they include methacrylic acid copolymers, acrylic acid copolymers, itaconic acid copolymers, crotonic acid copolymers, maleic acid copolymers and partially esterified maleic acid copolymers. They also include acidic cellulose derivatives having a carboxylic acid in its side chain. Further, adducts of an addition polymer having a hydroxyl group with a cyclic acid anhydride are also usable. Among them, [benzyl (meth)acrylate / (meth)acrylic acid / if necessary, another addition-polymerizable vinyl monomer] copolymers and [allyl (meth)acrylate / (meth)acrylic acid / if necessary, another addition-polymerizable vinyl monomer] copolymers are preferred. In addition, polyvinylpyrrolidone and polyethylene oxide are useful as water-soluble linear organic polymers. To increase the strength of the hardened film, an alcohol-soluble nylon or a polyether prepared from 2,2-bis(4-hydroxyphenyl)propane and epichlorohydrin is also usable. The linear organic polymer can be incorporated in the composition in a proper amount. However, when the amount exceeds 90%, preferred results cannot be obtained with respect to the intensity of the formed image. The amount is preferably 30 to 85%. The weight ratio of the photopolymerizable ethylenically unsaturated compound to the linear organic polymer is preferably 1/9 to 7/3, particularly 3/7 to 5/5.

A small amount of a heat polymerization inhibitor may be used in addition to the above-described indispensable components in order to inhibit unnecessary heat polymerization of the polymerizable ethylenically unsaturated compound in the course of the preparation or the storage of the photosensitive composition. Preferred heat polymerization inhibitors include, for example, hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and cerous N-nitrosophenylhydroxyamine. The amount of the heat polymerization inhibitor is preferably about 0.01 to 5% based on the total composition. If necessary, a higher fatty acid or its derivative, such as behenic acid or behenic acid amide may be added so that it is caused to float on the surface of the film composition in order to prevent the inhibition of the polymerization by oxygen. The amount of the higher fatty acid derivative is preferably about 0.5 to 10% based on the total composition. A dye or pigment may be incorporated into the composition in order to color the photosensitive layer. The amount of the dye or pigment is preferably about 0.5 to 5% based on the total composition. Further, an inorganic filler for improving the physical properties of the cured film and other known additives can be added to the composition.

When the photopolymerizable composition of the present invention is to be applied, it is dissolved in an organic solvent. The organic solvents usable herein include, for example, acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monoethyl ether, propylene glycol monomethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monomethyl ether acetate, 3-methoxypropyl acetate, N,N'-dimethylformamide, dimethyl sulfoxide, γ-butyrolactone, methyl lactate and ethyl lactate. These solvents are usable either singly or as a mixture thereof. The solid content of the coating solution is preferably 2 to 50%.

The coated amount of the solution is preferably about 0.1 to 10 g/m², more preferably 0.5 to 5 g/m², on the dry basis.

Dimensionally stable plates are used as supports. They include, for example, paper; paper sheets laminated with a plastic (such as polyethylene, polypropylene or polystyrene); metal plates such as aluminum (including aluminum alloys), zinc and copper plates; plastic films such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal; and paper or plastic films laminated with the above-mentioned metals or on which the metals are vapor-deposited. Among these supports, the aluminum plate is particularly preferred, because it has quite a high dimensional stability and is inexpensive. Composite sheets comprising a polyethylene terephthalate film bonded to an aluminum sheet as described in J. P. KOKAI No. 48-18327 are also preferred.

The metal supports, particularly those having the aluminum surface, are preferably grained, immersed in an aqueous solution of sodium silicate, potassium fluorozirconate or a phosphate, or anodically oxidized.

An aluminum plate which has been grained and then immersed in an aqueous sodium silicate solution is preferably used. An aluminum plate, which has been anodically oxidized and then immersed in an aqueous solution of an alkali metal silicate as described in J. P. KOKOKU No. 47-5125, is also preferred. The anodic oxidation is conducted by using the aluminum plate as an anode in an electrolytic solution comprising an aqueous or non-aqueous solution of an inorganic acid such as phosphoric, chromic, sulfuric or boric acid, an organic acid such as oxalic or sulfamic acid or a salt thereof. The solutions can be used either solely or as a combination thereof.

Further, the electrodeposition of a silicate as described in U.S. Pat. No. 3,658,662 is also effective.

In addition, the electrolytically grained supports and those which are subjected to a surface treatment comprising a combination of the anodic oxidation and sodium silicate treatment as described in J. P. KOKOKU No. 46-27481 and J. P. KOKAI Nos. 52-58602 and 52-30503, are also useful.

The supports, which are subjected to a mechanical surface-roughening treatment, chemical etching, electrolytic graining, anodic oxidation treatment and sodium silicate treatment in this order as described in J. P. KOKAI No. 56-28893, are also preferred.

The supports, which are subjected to the above-described treatment followed by priming with a water-soluble resin such as polyvinylphosphonic acid, a polymer or copolymer having a sulfonic acid group in a side chain thereof, polyacrylic acid, a water-soluble metal salt (such as zinc borate), a yellow dye or an amine salt, are also preferred.

These treatments for imparting an affinity for water are effective not only for making the surface of the support hydrophilic, but also for preventing harmful reaction from taking place on the surface of the photopolymerizable composition and also improving the adhesion of the photosensitive layer.

A protective layer comprising a polymer having an excellent oxygen-screening effect, such as polyvinyl alcohol, particularly that having a saponification degree of at least 99%, or acidic cellulose may be formed on the photopolymerizable composition layer formed on the support in order to prevent a polymerization-inhibiting effect of oxygen in air. Methods of forming the protective layer are described in detail in, for example, U.S. Pat. No. 3,458,311 and J. P. KOKOKU No. 55-49729.

The photopolymerizable composition of the present invention is usable for an ordinary photopolymerization reaction. Further, it is usable for various applications, such as application as a photoresist to be used in the preparation of printing plates and printed boards.

Excellent effects are obtained particularly when the photopolymerizable composition of the present invention is used as a photosensitive material for a visible light laser such as $Ar^+$ laser, because it has specific characteristics, namely high sensitivity and broad spectral sensitivity over the visible ray region.

A printing plate prepared by using the photopolymerizable composition of the present invention is exposed, and an unexposed part of the photosensitive layer is removed with a developer to form an image. Developers which are preferably usable for a lithographic plate using the photopolymerizable composition of the present invention, include those described in J. P. KOKOKU No. 57-7427. They include, for example, aqueous solutions of inorganic alkalis, such as sodium silicate, potassium silicate, sodium hydroxide, potassium hydroxide, lithium hydroxide, trisodium phosphate, disodium hydrogenphosphate, triammonium phosphate, diammonium hydrogenphosphate, sodium metasilicate, sodium hydrogencarbonate and aqueous ammonia; and aqueous solutions of organic alkalis, such as monoethanolamine and diethanolamine. The alkali solution is used in such an amount that its concentration will be 0.1 to 10%, preferably 0.5 to 5%.

The aqueous alkaline solution may contain, if necessary, small amounts of a surfactant and an organic solvent such as benzyl alcohol, 2-phenoxyethanol or 2-butoxyethanol. They are described in, for example, U.S. Pat. Nos. 3,375,171 and 3,615,480.

Further, the developers as described in J. P. KOKAI Nos. 50-26601 and 58-54341 and J. P. KOKOKU Nos. 56-39464 and 56-42860 are also excellent.

The photopolymerizable composition of the present invention is highly sensitive to active light over a wide region from ultraviolet rays to visible rays. Therefore, various light sources such as ultra-high pressure, high pressure, medium pressure and low pressure mercury lamps, a chemical lamp, a carbon arc lamp, a xenone lamp, a metal halide lamp, a visible light or ultraviolet laser lamp, a luminescent lamp, a tungsten lamp and solar rays are usable.

The following examples will further illustrate the present invention, which by no means limit the scope of the present invention.

EXAMPLES 1 TO 11 AND COMPARATIVE EXAMPLES 1 TO 6

An aluminum plate having a thickness of 0.30 mm was grained with a nylon brush and an aqueous suspension of 400 mesh pumice powder and then the grained surface was thoroughly washed with water. The plate etched by immersing it in a 10% sodium hydroxide solution at 70° C. for 60 sec., washed with running water, neutralized with a 20% nitric acid solution and then washed with water. The plate was electrolytically surface-roughened in a 1% aqueous nitric acid solution. The electrolytic surface-roughening was conducted using alternating sine current under the conditions of anodic voltage $V_A$ of 12.7V so that the hourly quantity of electricity at the anode time was 160 $C/dm^2$. The surface roughness was 0.6 $\mu$(Ra). The plate was then desmatted by immersing it in a 30% aqueous sulfuric acid solution, at 55° C. for 2 min. and anodically oxidized in a 20% aqueous sulfuric acid solution at a current density of $2A/dm^2$ to control the thickness thereof to 2.7 $g/m^2$.

A photosensitive composition comprising the following components was applied to the resultant aluminum plate in an amount of 1.4 g/m² (on dry basis) and then dried at 80° C. for 2 min. to form a photosensitive layer:

| | |
|---|---|
| Trimethylolpropane tri(acryloyl-oxypropyl) ether | 2.0 g |
| Allyl methacrylate/methacrylic acid copolymer (molar ratio: 80/20) | 2.0 g |
| Photopolymerization initiator | X g |
| Fluorine-containing nonionic surfactant | 0.03 g |
| Methyl ethyl ketone | 20 g |
| Propylene glycol monomethyl ether acetate | 20 g |

A 3% aqueous solution of polyvinyl alcohol having a saponification degree of 86.5 to 89 molar % and degree of polymerization of 1,000 was applied to the photosensitive layer in an amount of 2 g/m² (on dry basis) and then dried at 100° C. for 2 min.

In the photosensitivity tests in the visible light region, a monochromatic light of visible light or Ar⁺ laser light (wave length=488 nm) was used. The visible light was obtained from a tungsten lamp as the light source through Kenko Optical Filter BP-49. The photosensitivity was determined with Fuji PS Step Guide (step tablets of Fuji Photo Film Co., Ltd.; the transmitted optical density in the first step being 0.05, which was increased by 0.15 per each step until 15th step). The result was shown in terms of the number of clear steps in the PS step guide after exposure of the sensitive material surface to the light of 25 LUX for 120 sec.

The sample was scanned through an ND filter with a single Ar⁺ laser beam having a beam diameter of 25 μm at a wavelength of 488 nm (*Model 95-3 manufactured by Lexel Co.) with its intensity being varied. After the development, the width of the reproduced line was measured, and the intensity of the laser beam which afforded a reproduced line width of 25 μm was taken as sensitivity.

The development was conducted by immersion in a developer having the following composition at 25° C. for 1 min.:

| | |
|---|---|
| 1 K Potassium silicate [Specific gravity (20° C. B(e)): 52–53, Molar ratio: 1.8–2.2, SiO₂ %: 27.5–29, K₂O %: 21–23, and Fe ≦ 0.02%] | 30 g |
| Potassium hydroxide | 15 g |

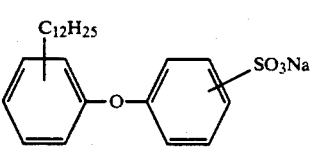

3 g

| | |
|---|---|
| Water | 1000 g |

The results of the sensitivities obtained with various photopolymerization initiators are shown in the following Table 1.

TABLE 1

| | Photopolymerization initiator (amount) | Number of steps (BP-49 Filter) | Sensitivity to Ar⁺ laser light (mJ/cm²) |
|---|---|---|---|
| Example 1 | Compound No. 77 (0.1 g) | 7.7 | 1.6 |
| Example 2 | Compound No. 77 (0.1 g) Compound II No. 42 (0.045 g) | 7.7 | 1.6 |
| Example 3 | Compound No. 77 (0.1 g) Compound I No. 25 (0.044 g) | 7.7 | 1.6 |
| Example 4 | Compound No. 77 (0.1 g) Compound II No. 52 (0.055 g) | 8.1 | 1.4 |
| Example 5 | Compound No. 77 (0.1 g) Compound II No. 53 (0.045 g) | 7.9 | 1.5 |
| Example 6 | Compound No. 77 (0.1 g) Compound II No. 44 (0.054 g) | 8.0 | 1.5 |
| Example 7 | Compound No. 77 (0.1 g) Compound II No. 43 (0.053 g) | 7.9 | 1.5 |
| Example 8 | Compound No. 77 (0.1 g) Compound V No. 63 (0.047 g) | 7.9 | 1.5 |
| Example 9 | Compound No. 77 (0.1 g) Compound VI No. 71 (0.053 g) | 8.0 | 1.5 |
| Example 10 | Cl⁻ salt of Dye No. 84 cation (0.058 g) Compound b (0.045 g) Compound I No. 17 (0.038 g) | 8.6 | 1.2 |
| Example 11 | Cl⁻ salt of Dye No. 85 cation (0.036 g) Compound a (0.052 g) Compound I No. 17 (0.038 g) | 8.6 | 1.2 |
| Comp. Ex. 1 | Compound No.77 (0.1 g) | 6.4 | 2.6 |
| Comp. Ex. 2 | Cl⁻ salt of Dye No. 84 cation (0.058 g) Compound b (0.045 g) | 7.4 | 1.9 |
| Comp. Ex. 3 | Cl⁻ salt of Dye No. 85 cation (0.035 g) Compound a (0.045 g) | 7.4 | 1.9 |
| Comp. Ex. 4 | Cl⁻ salt of Dye No. 84 cation (0.058 g) | No image formed | 48 or higher |
| Comp. Ex. 5 | Compound b | No image formed | 48 or higher |
| Comp. Ex. 6 | Compound b No. 17 | No image formed | 48 or higher |

EXAMPLES 12 TO 14

Photosensitive lithographic plates were prepared in the same manner as those of Examples 1, 8 and 9 except that a layer of a composition comprising a polyvinyl alcohol having a saponification degree of 99.3 to 99.9% and a degree of polymerization of 1,000 was formed in place of the above-described protective layer on the photosensitive layer. The photosensitivities of the plates were determined in the same manner as the above.

TABLE 2

| | Photopolymerization initiator (amount) | Number of clear steps with BP-40 filter light (number of steps) | Sensitivity to Ar⁺ laser light (mJ/cm²) |
|---|---|---|---|
| Example 12 | the same as that of Example 1 | 8.7 | 1.1 |
| Example 13 | the same as that of Example 8 | 9.9 | 0.6 |
| Example 14 | the same as that | 9.7 | 0.8 |

TABLE 2-continued

| Photo-polymerization initiator (amount) | Number of clear steps with BP-40 filter light (number of steps) | Sensitivity to Ar+ laser light (mJ/cm²) |
|---|---|---|
| of Example 9 | | |

EXAMPLES 15 TO 50 AND COMPARATIVE EXAMPLES 7 TO 60

Example 1 was repeated to prepare presensitized plates having the protective layer on the photosensitive layer.

In the photosensitivity test, the light from a tungsten lamp as a light source was used. The photosensitivity was determined with Fuji PS Step Guide (step tablets of Fuji Photo Film Co., Ltd.; the transmitted optical density in the first step being 0.05, which was increased by 0.15 per each step unit 15th step). The result was shown in terms of the number of clear steps in the PS step guide after exposure of the sensitive material surface to light of 800 LUX for 20 sec.

The development was conducted by immersion in a developer having the following composition at 25° C. for 1 min.:

| 1K Potassium silicate [Specific gravity (20° C. Bé): 52-53, Molar ratio: 1.8-2.2, SiO₂ %: 27.5-29, K₂O %: 21-23, and Fe ≦ 0.02%] | 30 g |
|---|---|
| Potassium hydroxide | 15 g |
| Sodium dodecyl phenoxybenzene Sulfonate | 3 g |
| Water | 1000 g |

The results of the sensitivities obtained with various photopolymerization initiators are shown in the following Table 3.

TABLE 3

| | Component (a) Dye (g) | Component (b) Borate (g) | Component (c) Compound of the formulae (I) to (VI) (g) | Number of Clear Steps |
|---|---|---|---|---|
| Example 15 | Cl⁻ Salt of Compound 84 (0.058) | Compound (b) (0.045) | No. 1 (0.032) | 9.4 |
| Example 16 | Cl⁻ Salt of Compound 84 (0.058) | Compound (b) (0.045) | No. 17 (0.038) | 9.3 |
| Example 17 | Cl⁻ Salt of Compound 84 (0.058) | Compound (b) (0.045) | No. 25 (0.044) | 9.3 |
| Example 18 | Cl⁻ Salt of Compound 84 (0.058) | Compound (b) (0.045) | No. 27 (0.040) | 9.2 |
| Example 19 | Cl⁻ Salt of Compound 84 (0.058) | Compound (b) (0.045) | No. 42 (0.045) | 9.3 |
| Example 20 | Cl⁻ Salt of Compound 84 (0.058) | Compound (b) (0.045) | No. 44 (0.054) | 9.7 |
| Example 21 | Cl⁻ Salt of Compound 84 (0.058) | Compound (b) (0.045) | No. 52 (0.055) | 9.8 |
| Example 22 | Cl⁻ Salt of Compound 84 (0.058) | Compound (b) (0.045) | No. 53 (0.045) | 9.5 |
| Example 23 | Cl⁻ Salt of Compound 84 (0.058) | Compound (b) (0.045) | 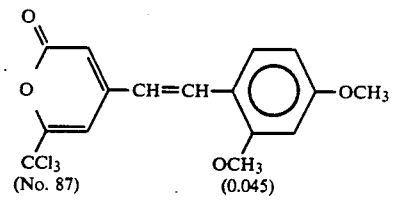 (No. 87) (0.045) | 8.8 |
| Example 24 | Cl⁻ Salt of Compound 84 (0.058) | Compound (b) (0.045) | 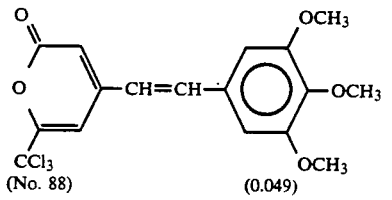 (No. 88) (0.049) | 8.7 |
| Example 25 | Cl⁻ Salt of Compound 84 (0.058) | Compound (b) (0.045) | 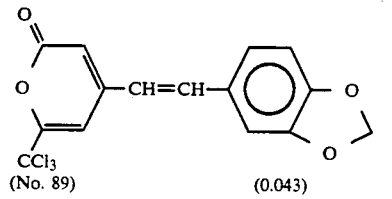 (No. 89) (0.043) | 8.7 |

TABLE 3-continued

| | Component (a) Dye (g) | Component (b) Borate (g) | Component (c) Compound of the formulae (I) to (VI) (g) | Number of Clear Steps |
|---|---|---|---|---|
| Example 26 | Cl⁻ Salt of Compound 84 (0.058) | Compound (b) (0.045) | 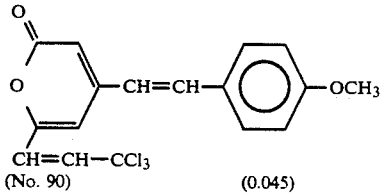 No. 90 (0.045) | 8.8 |
| Example 27 | Cl⁻ Salt of Compound 84 (0.058) | Compound (b) (0.045) | No. 56 (0.048) | 8.7 |
| Example 28 | Cl⁻ Salt of Compound 84 (0.058) | Compound (b) (0.045) | No. 57 (0.056) | 8.6 |
| Example 29 | Cl⁻ Salt of Compound 84 (0.058) | Compound (b) (0.045) | No. 61 (0.047) | 8.7 |
| Example 30 | Cl⁻ Salt of Compound 84 (0.058) | Compound (b) (0.045) | No. 62 (0.052) | 8.5 |
| Example 31 | Cl⁻ Salt of Compound 84 (0.058) | Compound (b) (0.045) | No. 63 (0.045) | 8.7 |
| Example 32 | Cl⁻ Salt of Compound 84 (0.058) | Compound (b) (0.045) | No. 64 (0.049) | 8.7 |
| Example 33 | Cl⁻ Salt of Compound 84 (0.058) | Compound (b) (0.045) | No. 66 (0.081) | 8.6 |
| Example 34 | Cl⁻ Salt of Compound 84 (0.058) | Compound (b) (0.045) | No. 67 (0.072) | 8.6 |
| Example 35 | Cl⁻ Salt of Compound 84 (0.058) | Compound (b) (0.045) | No. 68 (0.045) | 8.6 |
| Example 36 | Cl⁻ Salt of Compound 84 (0.058) | Compound (b) (0.045) | No. 69 (0.049) | 8.7 |
| Example 37 | Cl⁻ Salt of Compound 84 (0.058) | Compound (b) (0.045) | No. 70 (0.051) | 8.7 |
| Example 38 | Cl⁻ Salt of Compound 84 (0.058) | Compound (b) (0.045) | No. 71 (0.048) | 8.7 |
| Comparative Example 7 | Cl⁻ Salt of Compound 84 (0.058) | Compound (b) (0.045) | — | 7.9 |
| Comparative Example 8 | Cl⁻ Salt of Compound 84 (0.058) | Compound (b) (0.090) | — | 8.0 |
| Comparative Example 9 | Cl⁻ Salt of Compound 84 (0.058) | — | No. 1 (0.032) | No Image |
| Comparative Example 10 | Cl⁻ Salt of Compound 84 (0.058) | — | No. 17 (0.038) | No Image |
| Comparative Example 11 | Cl⁻ Salt of Compound 84 (0.058) | — | No. 25 (0.044) | No Image |
| Comparative Example 12 | Cl⁻ Salt of Compound 84 (0.058) | — | No. 27 (0.040) | No Image |
| Comparative Example 13 | Cl⁻ Salt of Compound 84 (0.058) | — | No. 42 (0.045) | No Image |
| Comparative Example 14 | Cl⁻ Salt of Compound 84 (0.058) | — | No. 44 (0.054) | No Image |
| Comparative Example 15 | Cl⁻ Salt of Compound 84 (0.058) | — | No. 52 (0.055) | No Image |
| Comparative Example 16 | Cl⁻ Salt of Compound 84 (0.058) | — | No. 53 (0.045) | No Image |
| Comparative | Cl⁻ Salt of | — | No. 87 (0.045) | No |

TABLE 3-continued

| | Component (a) Dye (g) | Component (b) Borate (g) | Component (c) Compound of the formulae (I) to (VI) (g) | Number of Clear Steps |
|---|---|---|---|---|
| Example 17 | Compound 84 (0.058) | | | Image |
| Comparative Example 18 | Cl⁻ Salt of Compound 84 (0.058) | — | No. 88 (0.049) | No Image |
| Comparative Example 19 | Cl⁻ Salt of Compound 84 (0.058) | — | No. 89 (0.043) | No Image |
| Comparative Example 20 | Cl⁻ Salt of Compound 84 (0.058) | — | No. 90 (0.045) | No Image |
| Comparative Example 21 | Cl⁻ Salt of Compound 84 (0.058) | — | No. 56 (0.048) | No Image |
| Comparative Example 22 | Cl⁻ Salt of Compound 84 (0.058) | — | No. 57 (0.056) | No Image |
| Comparative Example 23 | Cl⁻ Salt of Compound 84 (0.058) | — | No. 61 (0.047) | No Image |
| Comparative Example 24 | Cl⁻ Salt of Compound 84 (0.058) | — | No. 62 (0.052) | No Image |
| Comparative Example 25 | Cl⁻ Salt of Compound 84 (0.058) | — | No. 63 (0.045) | No Image |
| Comparative Example 26 | Cl⁻ Salt of Compound 84 (0.058) | — | No. 64 (0.049) | No Image |
| Comparative Example 27 | Cl⁻ Salt of Compound 84 (0.058) | — | No. 66 (0.081) | No Image |
| Comparative Example 28 | Cl⁻ Salt of Compound 84 (0.058) | — | No. 67 (0.072) | No Image |
| Comaprative Example 29 | Cl⁻ Salt of Compound 84 (0.058) | — | No. 68 (0.045) | No Image |
| Comparative Example 30 | Cl⁻ Salt of Compound 84 (0.058) | — | No. 69 (0.049) | No Image |
| Comparative Example 31 | Cl⁻ Salt of Compound 84 (0.058) | — | No. 70 (0.051) | No Image |
| Comparative Example 32 | Cl⁻ Salt of Compound 84 (0.058) | — | No. 71 (0.048) | No Image |
| Comparative Example 33 | Cl⁻ Salt of Compound 84 (0.058) | — | No. 1 (0.064) | No Image |
| Comparative Example 34 | Cl⁻ Salt of Compound 84 (0.058) | — | No. 17 (0.076) | No Image |
| Comparative Example 35 | Cl⁻ Salt of Compound 84 (0.058) | — | No. 25 (0.088) | No Image |
| Comparative Example 36 | Cl⁻ Salt of Compound 84 (0.058) | — | No. 27 (0.080) | No Image |
| Comparative Example 37 | Cl⁻ Salt of Compound 84 (0.058) | — | No. 42 (0.090) | No Image |
| Comparative Example 38 | Cl⁻ Salt of Compound 84 (0.058) | — | No. 44 (0.108) | No Image |
| Comparative Example 39 | Cl⁻ Salt of Compound 84 (0.058) | — | No. 52 (0.11) | No Image |
| Comparative Example 40 | Cl⁻ Salt of Compound 84 (0.058) | — | No. 53 (0.090) | No Image |
| Comparative Example 41 | Cl⁻ Salt of Compound 84 (0.058) | — | No. 87 (0.090) | No Image |
| Comparative Example 42 | Cl⁻ Salt of Compound 84 (0.058) | — | No. 88 (0.098) | No Image |
| Comparative | Cl⁻ Salt of | — | No. 89 (0.086) | No |

TABLE 3-continued

| | Component (a) Dye (g) | Component (b) Borate (g) | Component (c) Compound of the formulae (I) to (VI) (g) | Number of Clear Steps |
|---|---|---|---|---|
| Example 43 | Compound 84 (0.085) | | | Image |
| Comparative Example 44 | Cl⁻ Salt of Compound 84 (0.058) | — | No. 90 (0.090) | No Image |
| Comparative Example 45 | Cl⁻ Salt of Compound 84 (0.058) | — | No. 56 (0.098) | No Image |
| Comparative Example 46 | Cl⁻ Salt of Compound 84 (0.058) | — | No. 57 (0.112) | No Image |
| Comparative Example 47 | Cl⁻ Salt of Compound 84 (0.058) | — | No. 61 (0.094) | No Image |
| Comparative Example 48 | Cl⁻ Salt of Compound 84 (0.058) | — | No. 62 (0.104) | No Image |
| Comparative Example 49 | Cl⁻ Salt of Compound 84 (0.058) | — | No. 63 (0.090) | No Image |
| Comparative Example 50 | Cl⁻ Salt of Compound 84 (0.058) | — | No. 64 (0.098) | No Image |
| Comparative Example 51 | Cl⁻ Salt of Compound 84 (0.058) | — | No. 66 (0.162) | No Image |
| Comparative Example 52 | Cl⁻ Salt of Compound 84 (0.058) | — | No. 67 (0.144) | No Image |
| Comparative Example 53 | Cl⁻ Salt of Compound 84 (0.058) | — | No. 68 (0.104) | No Image |
| Comparative Example 54 | Cl⁻ Salt of Compound 84 (0.058) | — | No. 69 (0.098) | No Image |
| Comparative Example 55 | Cl⁻ Salt of Compound 84 (0.058) | — | No. 70 (0.120) | No Image |
| Comparative Example 56 | Cl⁻ Salt of Compound 84 (0.058) | — | No. 71 (0.096) | No Image |
| Example 39 | I⁻ Salt of Compound 77 (0.080) | Compound (g) (0.070) | No. 25 (0.044) | 11.5 |
| Example 40 | I⁻ Salt of Compound 77 (0.080) | Compound (g) (0.070) | No. 44 (0.054) | 12.0 |
| Example 41 | I⁻ Salt of Compound 77 (0.080) | Compound (g) (0.070) | No. 87 (0.045) | 10.8 |
| Example 42 | I⁻ Salt of Compound 77 (0.080) | Compound (g) (0.070) | No. 56 (0.048) | 10.8 |
| Example 43 | I⁻ Salt of Compound 77 (0.080) | Compound (g) (0.070) | No. 63 (0.045) | 10.7 |
| Example 44 | I⁻ Salt of Compound 77 (0.080) | Compound (g) (0.070) | No. 70 (0.051) | 10.7 |
| Comparative Example 57 | I⁻ Salt of Compound 77 (0.080) | Compound (g) (0.070) | — | 10.0 |
| Comparative Example 58 | I⁻ Salt of Compound 77 (0.080) | Compound (g) (0.140) | — | 10.2 |
| Example 45 | Cl⁻ Salt of Compound 75 (0.042) | Compound (d) (0.061) | No. 25 (0.044) | 10.4 |
| Example 46 | Cl⁻ Salt of Compound 75 (0.042) | Compound (d) (0.061) | No. 44 (0.054) | 11.0 |
| Example 47 | Cl⁻ Salt of Compound 75 (0.042) | Compound (d) (0.061) | No. 87 (0.045) | 9.7 |
| Example 48 | Cl⁻ Salt of Compound 75 (0.042) | Compound (d) (0.061) | No. 56 (0.048) | 9.8 |
| Example 49 | Cl⁻ Salt of | Compound (d) | No. 63 (0.045) | 9.6 |

TABLE 3-continued

| | Component (a) Dye (g) | Component (b) Borate (g) | Component (c) Compound of the formulae (I) to (VI) (g) | Number of Clear Steps |
|---|---|---|---|---|
| | Compound 75 (0.042) | (0.061) | | |
| Example 50 | Cl⁻ Salt of Compound 75 (0.042) | Compound (d) (0.061) | No. 70 (0.051) | 9.7 |
| Comparative Example 59 | Cl⁻ Salt of Compound 75 (0.042) | Compound (d) (0.061) | — | 8.0 |
| Comparative Example 60 | Cl⁻ Salt of Compound 75 (0.042) | Compound (d) (0.122) | — | 8.1 |

The results shows:
(1) High sensitivity (number of clear steps) can be obtained by the combination of these components (a) to (c) (see Example Nos. 15 to 50) (Example Nos. 39 to 44 and Nos. 45 to 50 use the other combinations of the cationic dye with the borate than those of Example Nos. 15 to 38).
(2) Any image cannot be produced without the component (b) (see Comparative Example Nos. 9 to 56).
(3) Only the combination of the components (a) with (b) cannot enhance the sensitivity of the photopolymerizable composition. Namely, Comparative Example No.8 uses the amount two times that of Comparative Example No.7 in respect of the borate (0.045g in Comparative Example No.7 vs. 0.090g in Comparative Example No.8). In this case, the sensitivity can be raised only by 0.1 even when the borate is used in the amount two times that of Comparative Example No.7. On the other hand, when the amount of the borate is maintained (0.045g) and when 0.048g of the compound (c) (No.71) is used, the sensitivity was raised by 0.8 (Example No.38) as compared with Comparative Example No.7. This is applicable to the relation among Example No.44 and Comparative Example Nos. 57 and 58.
(4) Incidentally, without a dye, of course, any image cannot be produced. Therefore, no image was produced without the component (a).

The same results could be obtained even when a salt of an organic boron anionic compound with an organic and cationic dye is used in place of the combination of the cationic dye with the borate as in Example Nos. 15 to 38 and Comparative Example Nos. 7 to 56.

What is claimed is:

1. A photopolymerizable composition comprising a polymerizable compound having at least one ethylenically unsaturated bond which is photopolymerizable with active light and a photopolymerization initiator, wherein said photopolymerization initiator comprises:
   (a) at least one salt of an organic boron anionic compound with an organic and cationic dye, and at least one compound represented by formula (I), (II), (III), (IV), (V) or (VI), or
   (b) a combination of at least one organic and cationic dye with a salt of an organic boron anionic compound, and at least one compound represented by the following general formula (I), (II), (III), (IV), (V) or (VI):

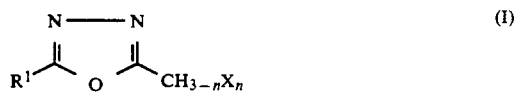

wherein
R₁ represents an alkyl group, a substituted alkyl group, an alkenyl group, a substituted alkenyl group, an allyl group, a substituted allyl group, an aryl group, a substituted aryl group, a halogen atom, an alkoxy group, a substituted alkoxy group, a nitro group or a cyano group,
X represents a halogen atom, and
n represents an integer of 1 to 3;

$$R^2-Z-CH_{m-1}X_m-R^3 \qquad (II)$$

wherein
R² represents an aryl group or a substituted aryl group,
R³ represents

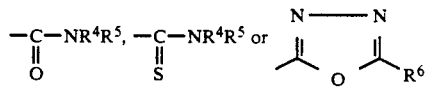

Z represents

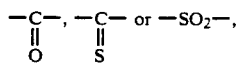

R⁴ and R⁵ each represents an alkyl group, a substituted alkyl group, an alkenyl group, a substituted alkenyl group, an allyl, group, a substituted allyl group, an aryl group or a substituted aryl group,
R⁶ is the same as R¹ of the general formula (I),
X represents a halogen atom, and
m represents 1 or 2;

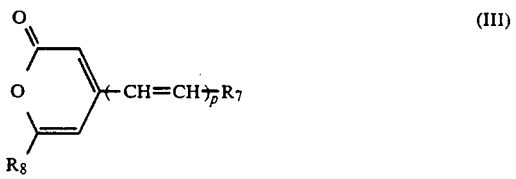

wherein $R_7$ represents a substituted or unsubstituted aryl group or heterocyclic group, $R_8$ represents a trihaloalkyl or trihaloalkenyl group having 1 to 3 carbon atoms, and p represents 1, 2 or 3;

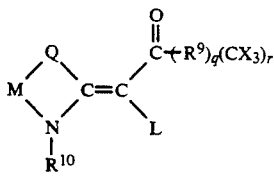
(IV)

wherein:

L represents a hydrogen atom or a substituent of the formula:

$CO$—$(R^9)_m(CX_3)_m$,

M represents a substituted or unsubstituted alkylene group,

Q represents a sulfur, selenium or oxygen atom, dialkylmethylene group, an alken-1,2-ylene group, 1,2-phenylene group or a N—R group, M and Q together form a three-membered or four-membered ring, $R^9$ represents a carbocyclic or heterocyclic aromatic group, $R^{10}$ represents an alkyl group, an aralkyl group or an alkoxyalkyl group, X represents a halogen atom, and q is 0 and r is 1 or, alternatively, q is 1 and r is 1 or 2;

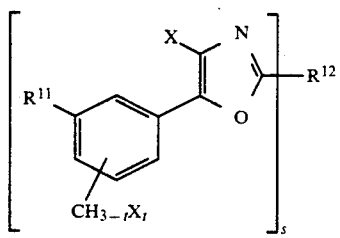
(V)

wherein

X represents a halogen atom, t represents an integer of 1 to 3, s represents an integer of 1 to 4, $R^{11}$ represents a hydrogen atom or a $CH_3-_tX_t$ group, and $R^{12}$ represents a substituted or unsubstituted S-valent unsaturated organic group; and

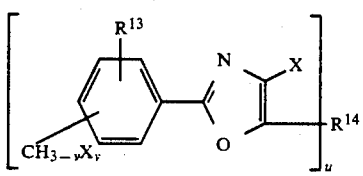
(VI)

wherein

X represents a halogen atom, v represents an integer of 1 to 3, u represents an integer of 1 to 4, $R^{13}$ represents a hydrogen atom or a $CH_3-_vX_v$ group, $R^{14}$ represents a u-valent, substituted or unsubstituted unsaturated organic group.

2. The photopolymerizable composition of claim 1, wherein said photopolymerization initiator is used in an amount of 0.01 to 60 wt. % based on the total amount of said polymerizable compound and said linear organic polymer.

3. The photopolymerizable composition of claim 2, wherein said photopolymerization initiator is used in an amount of 1 to 30 wt. % based on the total amount of said polymerizable compound and said linear organic polymer.

4. The photopolymerizable composition of claim 1, further comprising a linear organic polymer.

5. The photopolymerizable composition of claim 4, wherein said linear organic polymer is soluble or swellable in water or an alkaline aqueous solution.

6. The photopolymerizable composition of claim 5, wherein said linear organic polymer is selected from the group consisting of acrylic acid copolymer or methacrylic acid copolymer, itaconic acid copolymer, crotonic acid copolymer, maleic acid copolymer, and partially esterified maleic acid copolymer.

7. The photopolymerizable composition of claim 6, comprising said linear organic polymer in an amount of 5–50% by weight based on the total weight of the composition.

8. The photopolymerizable composition of claim 1, wherein said salt of an organic boron anionic compound with an organic and cationic dye is defined by the general formula:

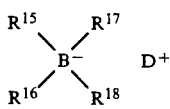

wherein $D^+$ represents an organic and cationic dye, $R^{15}$, $R^{16}$, $R^{17}$ and $R^{18}$ may be the same or different and each represents an alkyl group, an aryl group, an aralkyl group, an alkaryl group, an alkenyl group, an alkynyl group, an alicyclic group, a heterocyclic group, an allyl group, or a group derived from such a group, or two or more of $R^{15}$, $R^{16}$, $R^{17}$ and $R^{18}$ may be bonded together to form a cyclic structure.

9. The photopolymerizable composition of claim 8, wherein said organic and cationic dye is selected from the group consisting of polymethine dyes, cyanine dyes, azomethine dyes, triarylmethane dyes, xanthene dyes, acridine dyes, azine dyes, oxazine dyes, thiazine dyes, quinoline dyes, thiazole dyes, pyrylium dyes and thiapyrylium dyes.

10. The photopolymerizable composition of claim 8, wherein said salt of an organic boron anionic compound with an organic and cationic dye is defined by formula I or formula XI:

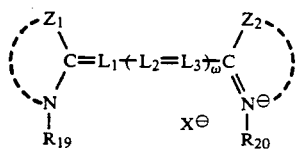

(I)

wherein,

- $Z_1$ and $Z_2$ each represents an atomic group necessary for forming a usual heterocyclic nucleus of a cyanine dye such as thiazole, thiazoline, benzothiazole, naphthothiazole, oxazole, oxazoline, benzoxazole, naphthoxazole, tetrazole, pyridine, quinoline, imidazoline, imidazole, benzimidazole, naphthoimidazole, selenazoline, selenazole, benzoselenazole, naphthoselenazole or indolenine nucleus which may be substituted with a lower alkyl group such as a methyl group, a halogen atom, a phenyl group, a hydroxyl group, an alkoxy group having 1 to 4 carbon atoms, a carboxyl group, an alkoxycarbonyl group, an alkylsulfamoyl group, an alkylcarbamoyl group, an acetyl group, an acetoxy group, a cyano group, a trichloromethyl group, a trifluoromethyl group or a nitro group,
- $L_1$, $L_2$ and $L_3$ represents a methine group which may be substituted with a lower alkyl group such as a methyl or ethyl group, a phenyl group, a substituted phenyl group, a methoxy group, an ethoxy group or an aralkyl group such as a phenethyl group,
- $L_1$ and $R_{19}$, $L_3$ and $R_{20}$, or $L_2$ and $L_2$ (in case $\omega$ is 3) may form an alkylene crosslinkage to form a five-membered or six-membered ring,
- $R_{19}$ and $R_{20}$ each represents a lower alkyl group (preferably an alkyl group having 1 to 8 carbon atoms), a carboxyl group, a sulfo group, a hydroxyl group, a halogen atom, an alkoxy group having 1 to 4 carbon atoms, a phenyl group or an alkyl group having a substituent such as a substituted phenyl group (preferably the alkylene moiety thereof having 1 to 5 carbon atoms) such as a $\beta$-sulfoethyl, $\gamma$-sulfopropyl, $\gamma$-sulfobutyl, $\delta$-sulfobutyl, 2-[2-(3-sulfopropoxy)ethoxy]ethyl, 2-hydroxysulfopropyl, 2-chlorosulfopropyl, 2-methoxyethyl, 2-hydroxyethyl, carboxymethyl, 2-carboxyethyl, 2,2,3,3'-tetrafluoropropyl or 3,3,3-trifluoroethyl group, an allyl group or a substituted alkyl group usually contained in cyanine dyes as an N-substituent,
- $\omega$ represents a number of 1, 2 or 3, and
- $X^-$ represents said boron anionic compound, and

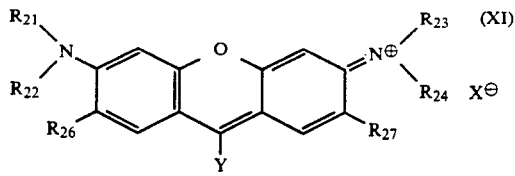

wherein

- $R_{21}$, $R_{22}$, $R_{23}$ and $R_{24}$ each represents a hydrogen atom, an alkyl group having 1 to 6 carbon atoms or an aryl group; $R_{26}$ and $R_{27}$ each represents a hydrogen atom, a substituted or unsubstituted alkyl group, a substituted or unsubstituted alkenyl group, a substituted or unsubstituted alkynyl group or, a substituted or unsubstituted aryl group;
- Y represents a hydrogen atom, a substituted or unsubstituted alkyl group, a substituted or unsubstituted alkenyl group, a substituted or unsubstituted alkynyl group, a substituted or unsubstituted aryl group, a substituted or unsubstituted heterocyclic group, or

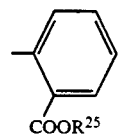

(wherein $R^{25}$ represents the same group as $R^{26}$ or an alkaline metal); and X represents the boron anionic compound of the above formula (VII).

11. The photopolymerizable composition of claim 10, comprising said linear organic polymer in an amount of 30–85% by weight based on the total weight of the composition.

12. The photopolymerizable composition of claim 8, wherein said salt of an organic boron anionic compound with an organic and cationic dye is selected from the group consisting of the following compounds:

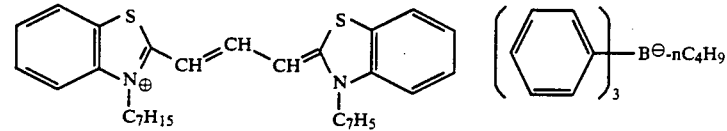

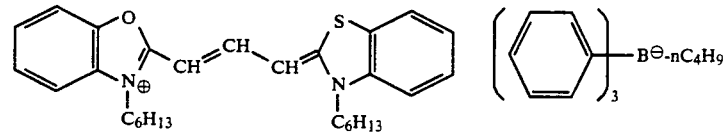

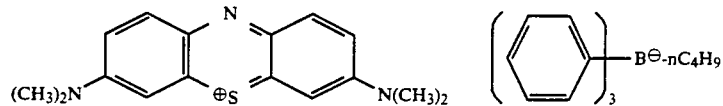

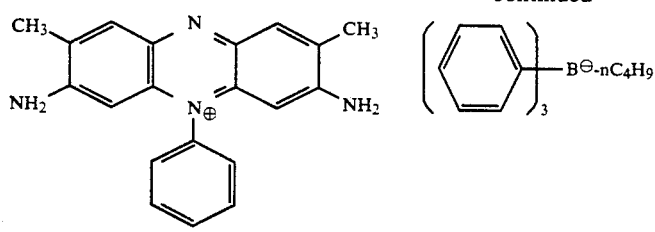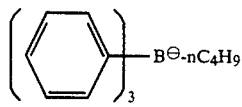
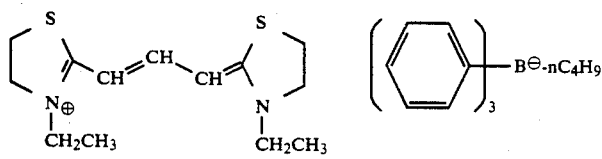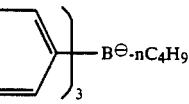
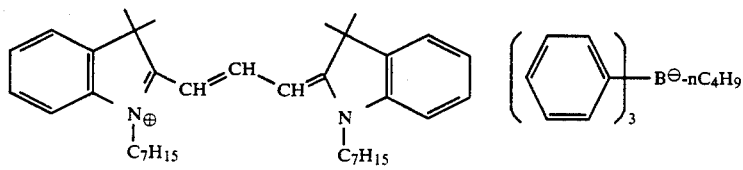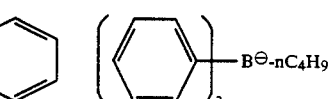
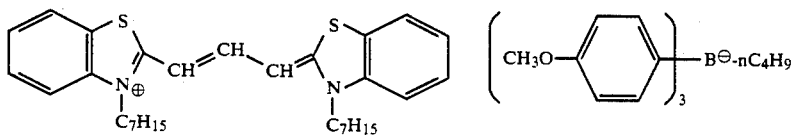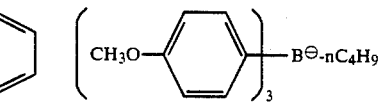
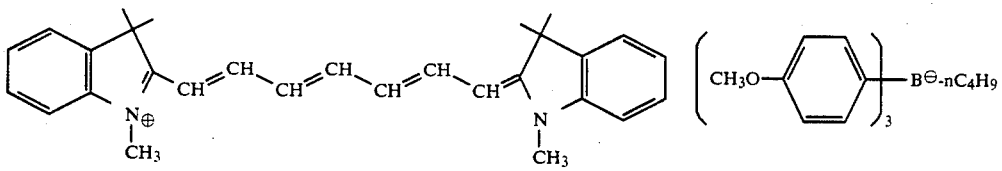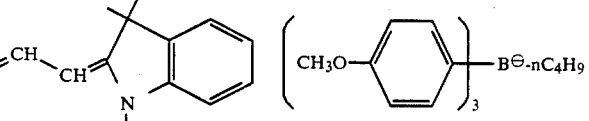
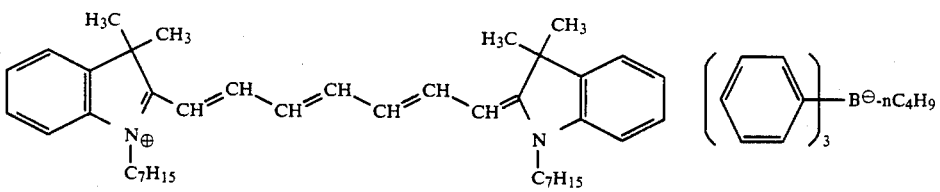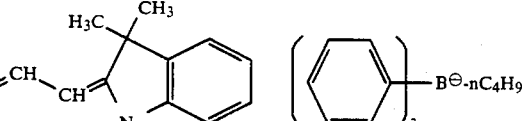
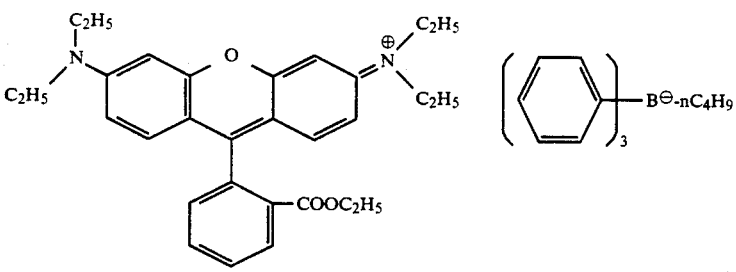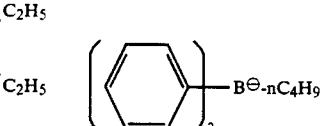
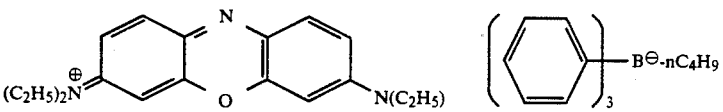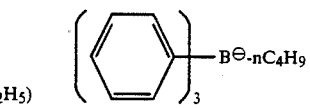
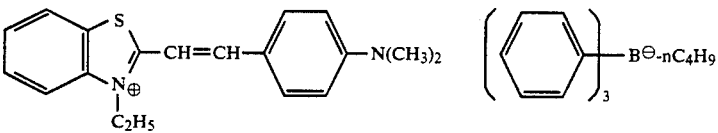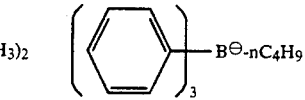

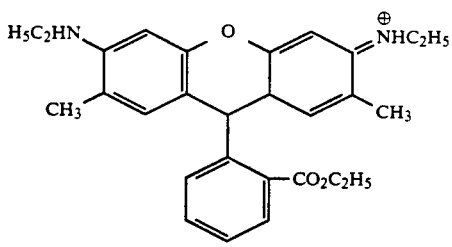
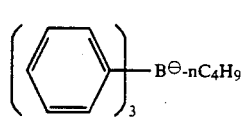

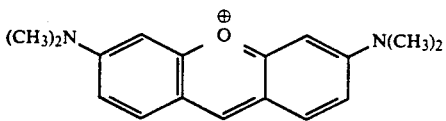
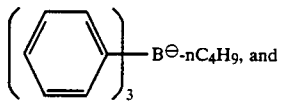

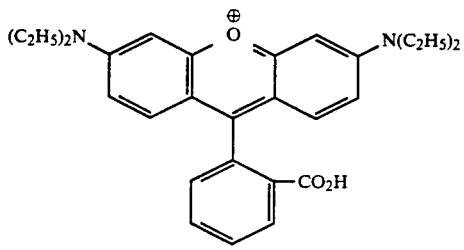
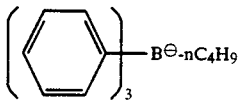

13. The photopolymerizable composition of claim 1, wherein said organic boron anionic compound is selected from the group consisting of the following compounds:

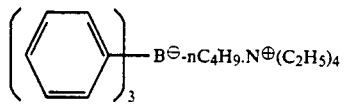

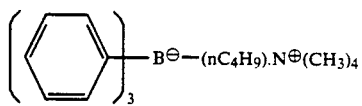

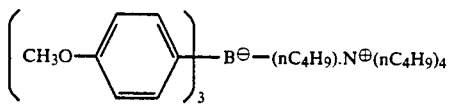

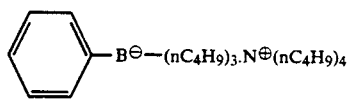

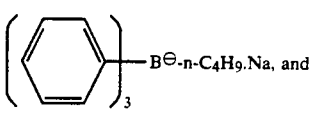

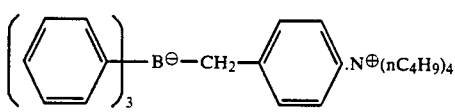

14. The photopolymerizable composition of claim 1, wherein said organic and cationic dye is defined by formula I or formula XI:

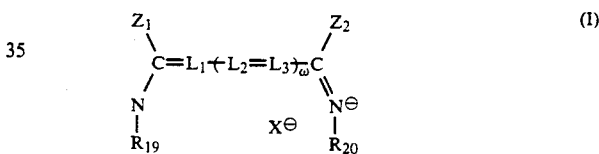

wherein, $Z_1$ and $Z_2$ each represents an atomic group necessary for forming a usual heterocyclic nucleus of a cyanine dye such as thiazole, thiazoline, benzothiazole, naphthothiazole, oxazole, oxazoline, benzoxazole, naphthoxazole, tetrazole, pyridine, quinoline, imidazoline, imidazole, benzimidazole, naphthoimidazole, selenazoline, selenazole, benzoselenazole, naphthoselenazole or indolenine nucleus which may be substituted with a lower alkyl group such as a methyl group, a halogen atom, a phenyl group, a hydroxyl group, an alkoxy group having 1 to 4 carbon atoms, a carboxyl group, an alkoxycarbonyl group, an alkylsulfamoyl group, an alkylcarbamoyl group, an acetyl group, an acetoxy group, a cyano group, a trichloromethyl group, a trifluoromethyl group or a nitro group, $L_1$, $L_2$ and $L_3$ each represents a methine group which may be substituted with a lower alkyl group such as a methyl or ethyl group, a phenyl group, a substituted phenyl group, a methoxy group, an ethoxy group or an aralkyl group such as a phenethyl group, $L_1$ and $R_{19}$, $L_3$ and $R_{20}$, or $L_2$ and $L_2$ (in case $\omega$ is 3) may form an alkylene crosslinkage to form a five-membered or six-membered ring, $R_{19}$ and $R_{20}$ each represents a lower alkyl group (preferably an alkyl group having 1 to 8 carbon atoms), a carboxyl group, a sulfo group, a hydroxyl group, a halogen atom, an alkoxy group having 1 to 4 carbon atoms, a phenyl group or an alkyl group having a substituent such as a substituted phenyl group (preferably the alkylene moiety thereof having 1 to 5 carbon atoms) such as a $\beta$-sulfoethyl, $\gamma$-sulfopropyl, $\gamma$-sulfobutyl, $\delta$-sulfobutyl, 2-[2-(3-sulfopropoxy)ethoxy]ethyl, 2-hydroxysulfopropyl, 2-chlorosulfopropyl, 2-methoxyethyl, 2-hydroxyethyl, carboxymethyl, 2-carboxyethyl, 2,2,3,3'-tetrafluoropropyl or 3,3,3-trifluoroethyl group, an allyl group or a substituted alkyl group usually contained in cyanine dyes as an N-substituent, $\omega$ represents a number of 1, 2 or 3, and $X^-$ represents $Cl^-$, $Br^-$, $F^-$, $BF_4^-$, $ClO_4^-$ or $PF_6^-$, and tetrafluoropropyl or 3,3,3-trifluoroethyl group, an allyl group or a substituted alkyl group usually contained in cyanine dyes as an N-substituent, $\omega$ represents a number of 1, 2 or 3, and $X^-$ represents said boron anionic compound, and

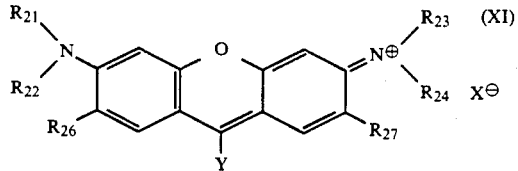

wherein
$R_{21}$, $R_{22}$, $R_{23}$ and $R_{24}$ each represents a hydrogen atom, an alkyl group having 1 to 6 carbon atoms or an aryl group; $R_{26}$ and $R_{27}$ each represents a hydrogen atom, a substituted or unsubstituted alkyl group, a substituted or unsubstituted alkenyl group, a substituted or unsubstituted alkynyl group or, a substituted or unsubstituted aryl group;

Y represents a hydrogen atom, a substituted or unsubstituted alkyl group, a substituted or unsubstituted alkenyl group, a substituted or unsubstituted alkynyl group, a substituted or unsubstituted aryl group, a substituted or unsubstituted heterocyclic group, or

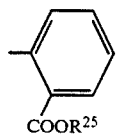

(wherein $R^{25}$ represents the same group as $R^{26}$ or an alkaline metal); and X represents the boron anionic compound of the above formula (VII).

* * * * *